(12) United States Patent
Nakatogawa

(10) Patent No.: US 10,990,133 B2
(45) Date of Patent: Apr. 27, 2021

(54) DISPLAY DEVICE

(71) Applicant: Japan Display Inc., Minato-ku (JP)

(72) Inventor: Hirondo Nakatogawa, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/738,029

(22) Filed: Jan. 9, 2020

(65) Prior Publication Data

US 2020/0142449 A1    May 7, 2020

Related U.S. Application Data

(63) Continuation of application No. PCT/JP2018/012863, filed on Mar. 28, 2018.

(30) Foreign Application Priority Data

Jul. 11, 2017   (JP) .............................. JP2017-135156

(51) Int. Cl.
    *G06F 1/16*     (2006.01)
    *G09F 9/30*     (2006.01)
    *G09G 3/3266*   (2016.01)

(52) U.S. Cl.
    CPC ............ *G06F 1/1652* (2013.01); *G09F 9/301* (2013.01); *G09G 3/3266* (2013.01)

(58) Field of Classification Search
    CPC ...... G06F 1/1652; G09F 9/301; G06G 3/3266
    USPC ....................................................... 345/204
    See application file for complete search history.

(56) References Cited

U.S. PATENT DOCUMENTS

| 2005/0225690 | A1* | 10/2005 | Battersby | ............... | G09G 5/005 |
| | | | | | 349/41 |
| 2009/0184954 | A1* | 7/2009 | Street | ........................ | G09F 9/30 |
| | | | | | 345/419 |
| 2011/0050657 | A1* | 3/2011 | Yamada | .............. | H01L 51/5237 |
| | | | | | 345/204 |
| 2015/0043142 | A1 | 2/2015 | Jang et al. | | |

(Continued)

FOREIGN PATENT DOCUMENTS

| JP | 2009-177179 A | 8/2009 |
| JP | 2011-170350 A | 9/2011 |

(Continued)

OTHER PUBLICATIONS

International Preliminary Report on Patentability and Written Opinion of the International Searching Authority dated Jan. 14, 2020 in PCT/JP2018/012863 (with English translation), 8 pages.

(Continued)

*Primary Examiner* — Mark Edwards
(74) *Attorney, Agent, or Firm* — Oblon, McClelland, Maier & Neustadt, L.L.P.

(57) ABSTRACT

A flat portion includes a corner side that is provided between the first and second sides and of which a tangent intersects the first and second sides. An inclined portion includes a first portion that is bent along the first side, a second portion that is bent along the second side, and a third portion that is bent from the corner side. A flexible display panel includes a notch that is provided between the first and second portions and of which a gap spreads in a direction away from the flat portion in a state where the flexible display panel is laid flat. Facing sides of the notch facing each other are adjacent to each other in a state where the flexible display panel is bent.

18 Claims, 16 Drawing Sheets

(56) References Cited

U.S. PATENT DOCUMENTS

2015/0103474 A1     4/2015   Cho
2016/0048254 A1     2/2016   Jang et al.
2018/0331124 A1*   11/2018   Cho .................... H01L 27/3276

FOREIGN PATENT DOCUMENTS

JP      2015-075760 A     4/2015
JP      2016-173461 A     9/2016

OTHER PUBLICATIONS

International Search Report dated May 29, 2018 in PCT/JP2018/012863 filed on Mar. 28, 2018, 2 pages.

\* cited by examiner

FIG.4
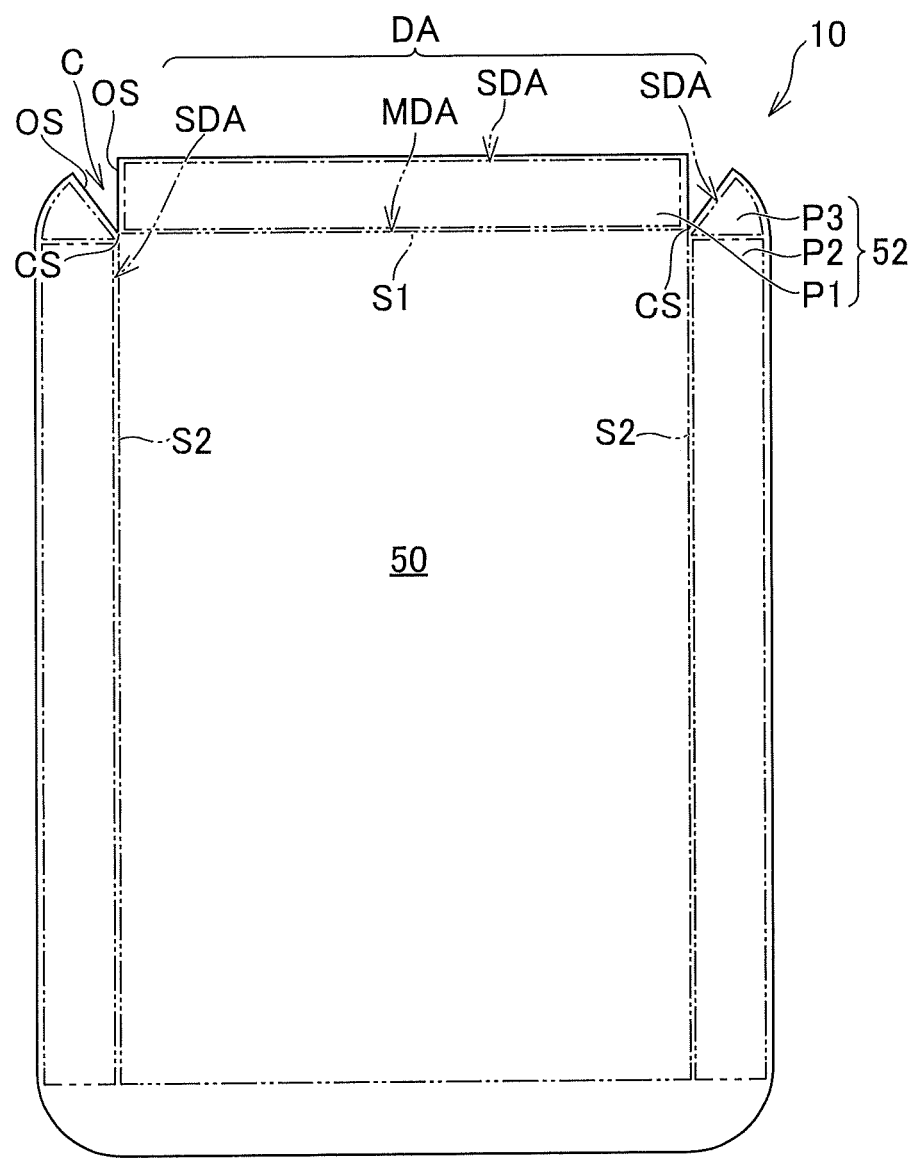
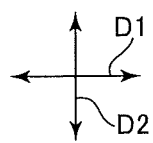

DISPLAY DEVICE

CROSS-REFERENCE TO RELATED APPLICATION

This application is a continuation application of International Application PCT/JP2018/012863 filed on Mar. 28, 2018, which claims priority from Japanese patent application JP2017-135156 filed on Jul. 11, 2017. The contents of these applications are incorporated herein by reference in their entirety.

BACKGROUND OF THE INVENTION

1. Field

The present invention relates to a display device.

2. Description of the Related Art

A flexible display that is flexibly deformable is known (JP 2016-173461 A). In one example, an end portion along one side of a rectangular external shape or an end portion along two sides opposite to each other are bent. By bending an end portion of a display area, designability can be improved.

The flexible display can be bent, that is, curved along a straight line but cannot be curved along a curved line. For example, an end portion along two sides adjacent to each other with a corner of a rectangle interposed therebetween cannot be continuously bent. Therefore, there is a restriction on design.

SUMMARY

An object of the present invention is to eliminate a restriction on bending.

According to the present invention, there is provided a display device including a flexible display panel that includes a display area on which an image is displayed, in which the display area includes a main display area and a sub-display area adjacent to the main display area, the flexible display panel includes a flat portion that includes the main display area and an inclined portion that extends to be bent and inclined from the flat portion and includes the sub-display area, the flat portion includes a first side that extends in a first direction, a second side that extends in a second direction intersecting the first direction, and a corner side that is provided between the first side and the second side and of which a tangent intersects both the first side and the second side, the inclined portion includes a first portion that is bent along the first side, a second portion that is bent along the second side, and a third portion that is bent from the corner side, the flexible display panel includes a notch that is provided between the first portion and the second portion and of which a gap spreads in a direction away from the flat portion in a state where the flexible display panel is laid flat, and facing sides of the notch facing each other are adjacent to each other in a state where the flexible display panel is bent.

According to the present invention, the flexible display includes the notch of which the gap spreads in the direction away from the flat portion. Therefore, the flexible display can be bent even at the corner side positioned between the first side and the second side.

BRIEF DESCRIPTION OF THE DRAWINGS

FIG. 4 is a plan view illustrating a state where a flexible display panel is laid flat;

DETAILED DESCRIPTION OF THE INVENTION

Figure 1:
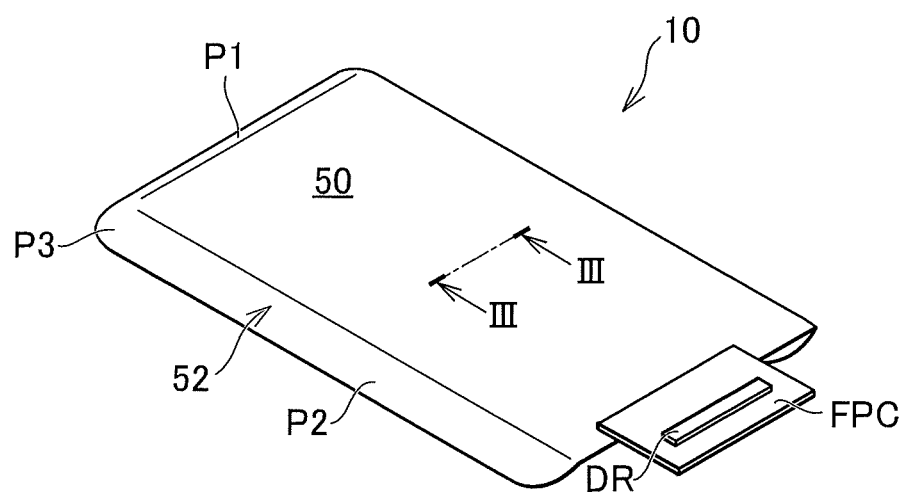
FIG. 1 is a perspective view illustrating a display device according to a first embodiment of the present invention.

Hereinafter, embodiments of the present invention will be described with reference to the drawings. The present invention can be embodied in various aspects in a range not departing from the scope of the present invention and is not intended to be limited to the following embodiments.

In the drawings, the widths, thicknesses, shapes, and the like of the respective components may be schematically illustrated as compared to the actual mode in order to further clarify the description but are merely exemplary and do not limit the present invention. In this specification and the respective drawings, components having the same functions described with reference to the previous drawing are represented by the same reference numerals, and the repeated description will not be made.

Further, in the detailed description of the present invention, when a positional relationship between one component and another component is defined, unless specified otherwise, the meaning of "on" or "under" refers to not only a case where the other component is positioned immediately above or immediately below the one component but also a case where still another component is interposed therebetween.

First Embodiment

FIG. 1 is a perspective view illustrating a display device according to a first embodiment of the present invention. The display device is an organic electroluminescence display device. For example, the display device combines unit pixels (sub-pixels) of a plurality of colors including red, green, and blue to form full-color pixels and to display a full-color image. The display device includes a bent flexible display panel 10. The flexible display panel 10 is connected to a flexible printed circuit FPC, and an IC driver DR is mounted on the flexible printed circuit FPC.

Figure 2:
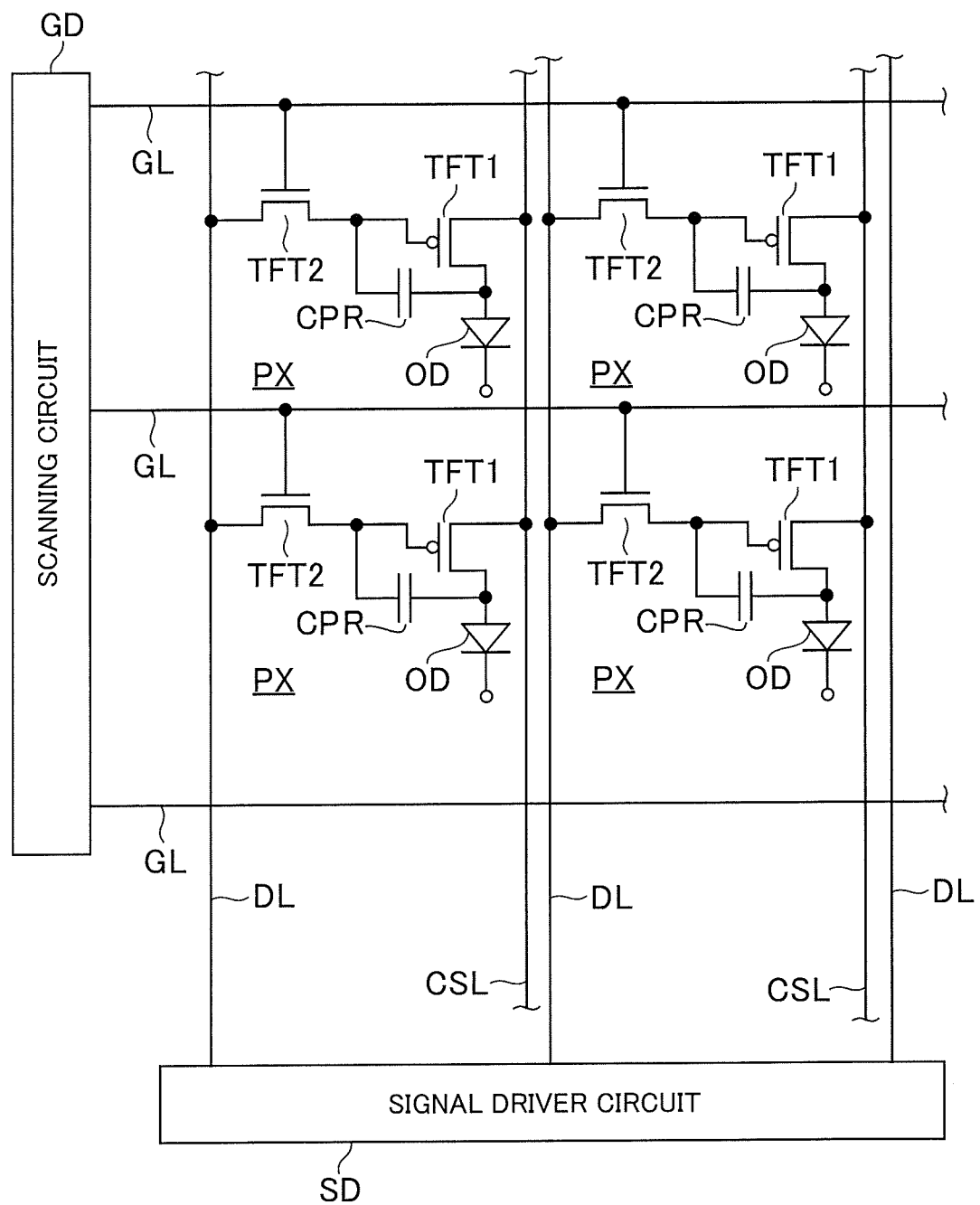
FIG. 2 is a circuit diagram illustrating the display device according to the first embodiment of the present invention.

FIG. 2 is a circuit diagram illustrating the display device illustrated in FIG. 1. A circuit includes: a plurality of scanning lines GL that are connected to a scanning circuit GD; and a plurality of signal lines DL that are connected to a signal driver circuit SD. The signal driver circuit SD is arranged in the IC driver DR. A region surrounded by adjacent two scanning lines GL and adjacent two signal lines DL is one pixel PX. The pixel PX includes a thin film transistor TFT1 as a driver transistor, a thin film transistor TFT2 as a switch, and a storage capacitor CPR. By applying a gate voltage to the scanning lines GL, the thin film transistor TFT2 is turned on, a video signal is supplied from the signal lines DL, and charge is stored in the storage capacitor CPR. When the storage capacitor CPR stores charge, the thin film transistor TFT1 is turned on, and a current flows from power lines CSL to a light emitting element OD. Due to this current, the light emitting element OD emits light.

Figure 3:
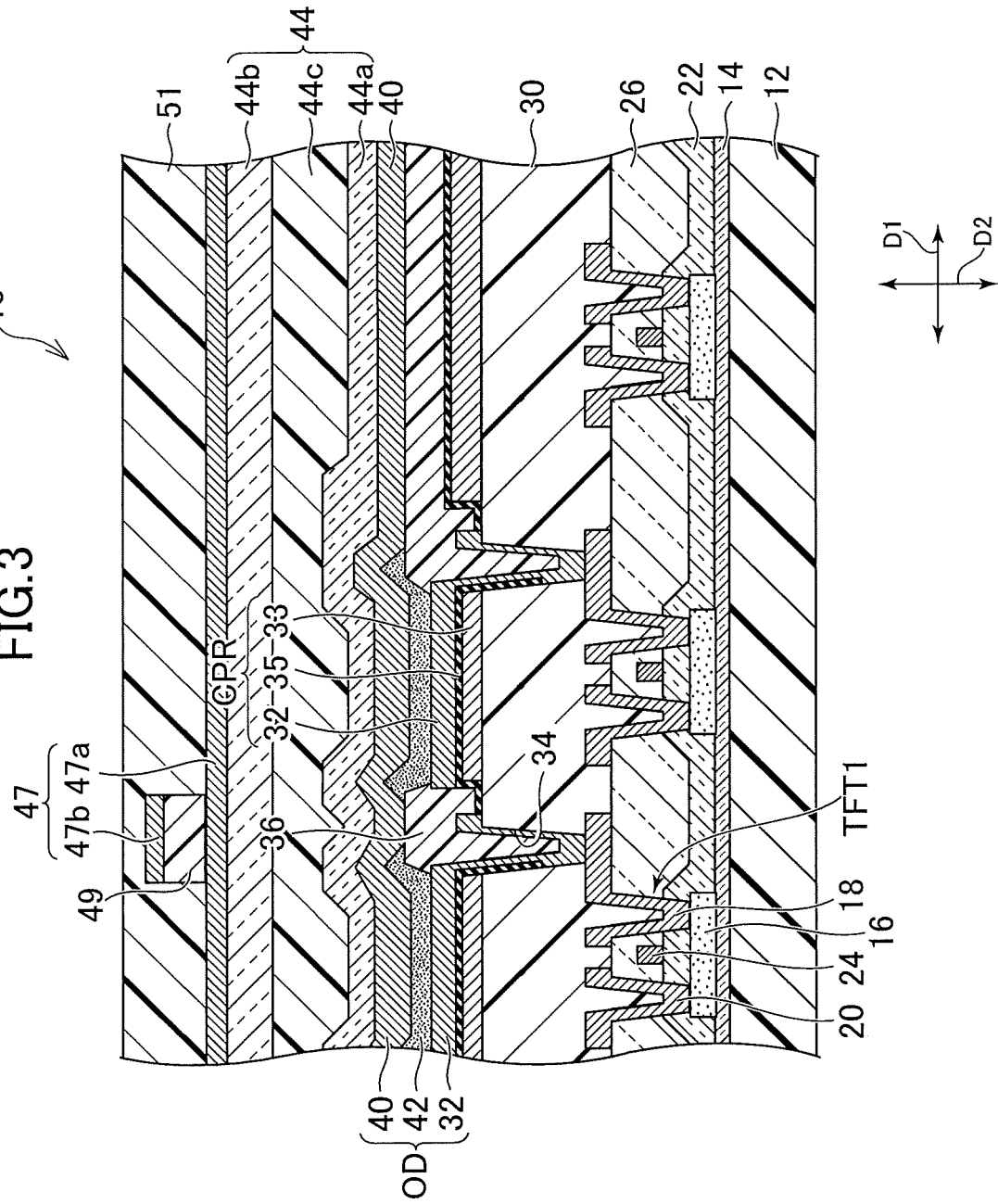
FIG. 3 is an enlarged view illustrating a cross-section of the display device illustrated in FIG. 1 taken along line III-III.

FIG. 3 is an enlarged view illustrating a cross-section of the display device illustrated in FIG. 1 taken along line III-III. The flexible display panel 10 includes a substrate 12. An undercoat layer 14 as a barrier for impurities is formed on the substrate 12, and a semiconductor layer 16 is formed on the undercoat layer 14. A source electrode 18 and a drain electrode 20 are electrically connected to the semiconductor layer 16, and a gate insulator film 22 is formed to cover the semiconductor layer 16. A gate electrode 24 is formed on the gate insulator film 22, and an interlayer insulating film 26 is formed to cover the gate electrode 24. The source electrode 18 and the drain electrode 20 penetrate the gate insulator film 22 and the interlayer insulating film 26. The semiconductor layer 16, the source electrode 18, the drain electrode 20, and the gate electrode 24 constitute at least a part of the thin film transistor TFT1.

A planarization layer 30 is provided on the interlayer insulating film 26. A plurality of pixel electrodes 32 (for example, anodes) that are configured to correspond to a plurality of unit pixels, respectively, are provided on the planarization layer 30. The planarization layer 30 is formed such that at least a surface thereof where the pixel electrodes 32 are provided is flat. The pixel electrode 32 is electrically connected to one of the source electrode 18 and the drain electrode 20 on the semiconductor layer 16 via a contact hole 34 penetrating the planarization layer 30.

The pixel electrode 32 constitutes a part of the light emitting element OD described below and also functions one electrode of the storage capacitor CPR. The storage capacitor CPR includes: the pixel electrode 32; a capacitive electrode 33 that is provided below the pixel electrode 32; and a dielectric insulating film 35 that is interposed between the pixel electrode 32 and the capacitive electrode 33. The storage capacitor CPR stores a signal for controlling a current to be supplied to the pixel electrode 32.

An insulating layer 36 is formed on the planarization layer 30 and the pixel electrode 32. The insulating layer 36 is placed on a peripheral portion of the pixel electrode 32 and is formed to form an opening in a part (for example, a center portion) of the pixel electrode 32. A bank surrounding a part of the pixel electrode 32 is formed by the insulating layer 36. The pixel electrode 32 is a part of the light emitting element OD. The light emitting element OD includes: a counter electrode 40 (for example, a cathode) that faces the plurality of the pixel electrodes 32; and an organic electroluminescence layer 42.

The organic electroluminescence layer 42 includes a light emitting layer. The light emitting layer is provided independently of (separately of) the pixel electrodes 32 and is also placed on the insulating layer 36. In this case, the light emitting layer emits blue, red, or green light corresponding to each of the pixels. The color corresponding to each of the pixels is not limited to blue, red, or green and may be, for example, yellow or white. The light emitting layer is formed, for example, by vapor deposition. Alternatively, the light emitting layer may be formed across a plurality of pixels on the entire surface covering a display area. That is, the light emitting layer may be continuously formed on the insulating layer 36. In this case, the light emitting layer is formed by coating using solvent dispersion. When the light emitting layer is formed across the plurality of pixels, white light is emitted in all the sub-pixels, and a component having a desired color wavelength is extracted through a color filter (not illustrated).

A hole injection/transport layer including at least one of a hole injection layer and a hole transport layer is interposed between the pixel electrode 32 and the light emitting layer. The hole injection/transport layer may be separately provided for each of the pixel electrodes 32 but, in the example of FIG. 3, is continuously formed across the entire display area. The hole injection/transport layer is in contact with the pixel electrode 32 and the insulating layer 36.

An electron injection/transport layer including at least one of an electron injection layer and an electron transport layer is interposed between the counter electrode 40 and the light emitting layer. The electron injection/transport layer may be separately provided for each of the pixel electrodes 32 but, in the example of FIG. 3, is continuously formed across the entire display area. The electron injection/transport layer is in contact with the counter electrode 40.

The light emitting layer is interposed between the pixel electrode 32 and the counter electrode 40 and emits light having a luminance that is controlled by a current flowing between the pixel electrode 32 and the counter electrode 40. The counter electrode 40 is formed of, for example, a metal thin film, has light transmitting properties, and allows transmission of light emitted from the light emitting layer to display an image. The pixel electrode 32 is formed of a reflective film that reflects the light emitted from the light emitting layer in a direction of the counter electrode 40, and one layer among a plurality of layers may be a reflective film.

The organic electroluminescence layer 42 is sealed with a sealing film 44 to block water. The sealing film 44 has a structure in which an organic layer 44c is interposed between a pair of inorganic layers 44a and 44b formed of an inorganic layer material such as silicon nitride.

A touch electrode 47 is provided in a sealing layer 46. The touch electrode 47 includes first electrodes 47a that extend in a first direction D1 and are adjacent in a second direction D2 intersecting (for example, perpendicular to) the first direction D1. The touch electrode 47 includes second electrodes 47b that extend in the second direction D2 and are adjacent in the first direction D1. An insulating layer 49 is interposed between the first electrode 47a and the second electrode 47b such that a current does not flow therebetween. Portions of the first electrode 47a and the second electrode 47b where the insulating layer 49 is interposed are positioned in different layers as illustrated in FIG. 3, but other portions are positioned in the same layer. Alternatively, the first electrode 47a and the second electrode 47b as a whole may be positioned in different layers.

FIG. 4 is a plan view illustrating a state where the flexible display panel is laid flat. The flexible display panel 10 includes a flat portion 50 (refer to FIG. 1). The flat portion 50 includes a first side S1 that extends in the first direction D1. A second side S2 is provided on each of both sides of the first side S1. The second side S2 extends in the second direction D2 intersecting the first direction D1. A corner side CS is provided between the first side S1 and the second side S2. The corner side CS is one point of a corner in FIG. 4 but is actually formed of a straight line or a curved line. A tangent of the corner side CS intersects both the first side S1 and the second side S2.

As illustrated in FIGS. 1 and 4, the flexible display panel 10 includes an inclined portion 52 that extends to be bent and inclined from the flat portion 50. The inclined portion 52 includes a first portion P1. The first portion P1 is bent in a range of an obtuse angle along the first side S1. That is, an angle between a the flat portion 50 and the first portion P1 at a backside of the substrate is the obtuse angle as illustrated in FIG. 1. The inclined portion 52 includes a second portion P2. The second portion P2 is bent in a range of an obtuse angle along the second side S2. That is, an angle between the flat portion 50 and the second portion P2 at a backside of the substrate is the obtuse angle as illustrated in FIG. 1. The inclined portion 52 includes a third portion P3. The third portion P3 is bent in a range of an obtuse angle from the corner side CS. That is, an angle between the flat portion 50 and a facing side OS at a backside of the substrate is the obtuse angle as illustrated in FIG. 1. An edge of the third portion P3 on a side away from the corner side CS has an arc shape.

The flexible display panel 10 includes a display area DA on which an image is displayed. The display area DA includes a main display area MDA. The main display area MDA is present in the flat portion 50. The display area DA includes a sub-display area SDA. The sub-display area SDA is present in the inclined portion 52. The sub-display area SDA is adjacent to the main display area MDA.

The flexible display panel 10 includes a notch C. The notch C has a V-shape in which an inner corner has an acute angle. A gap of the notch C spreads in a direction away from the flat portion 50 in a state where the flexible display panel 10 is laid flat (FIG. 4). The notch C is positioned between the first portion P1 and the second portion P2 and, in the example of FIG. 4, is positioned between the first portion P1 and the third portion P3. The second portion P2 and the third portion P3 are continuously integrated. In a state where the flexible display panel 10 is bent as illustrated in FIG. 1, facing sides OS of the notch C are adjacent to each other.

In the embodiment, the flexible display panel 10 includes the notch C of which the gap spreads in the direction away from the flat portion 50. Therefore, the flexible display panel 10 can be bent even at the corner side CS positioned between the first side S1 and the second side S2.

Figure 5:
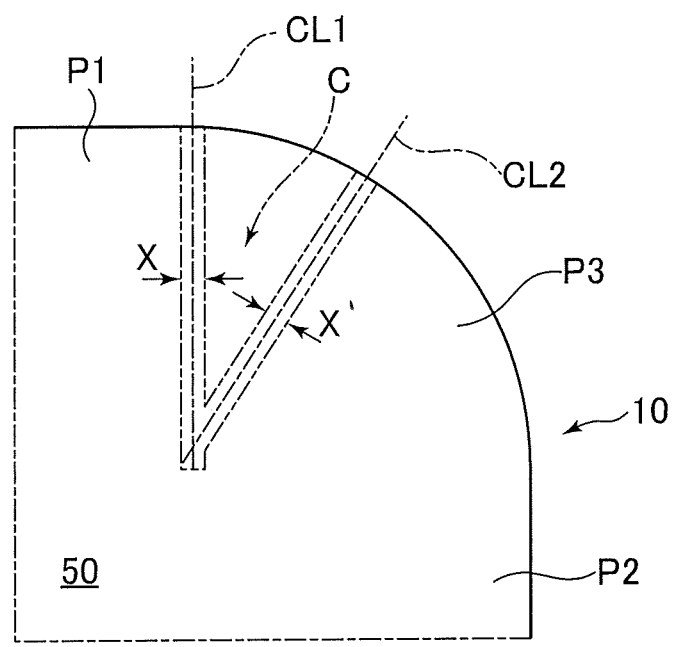
FIG. 5 is a diagram illustrating a method of forming a notch.

FIG. 5 is a diagram illustrating a method of forming the notch C. In order to form the notch C, the flexible display panel 10 is cut at a first cut line CL1 along a direction from the flat portion 50 to the first portion P1 and at a second cut line CL2 along a direction from the flat portion 50 to the third portion P3. The flexible display panel 10 may be cut at the second cut line CL2 after being cut at the first cut line CL1, or vice versa. The first cut line CL1 and the second cut line CL2 are set to intersect each other. The first cut line CL1 and the second cut line CL2 are lines but deviated from designed values in an actual process. Therefore, the cutting is performed in a region X having a width that can secure a tolerance. In the region X, a structure (for example, a pixel, a circuit, a water blocking structure, or a cathode contact) that should not be cut is not provided.

Figure 6:
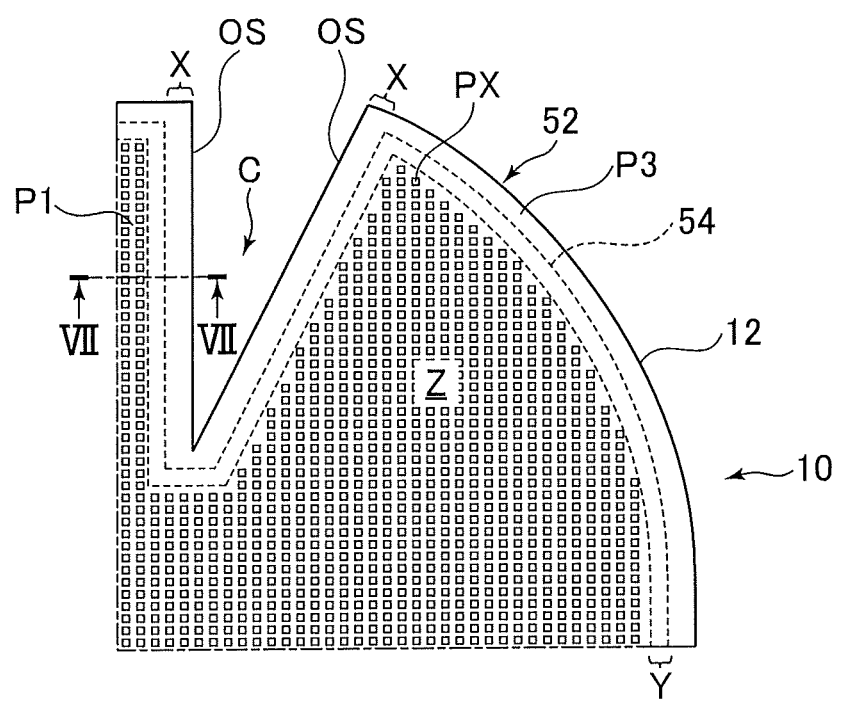
FIG. 6 is a diagram illustrating a structure of electrical connection of a counter electrode.

FIG. 6 is a diagram illustrating a structure of electrical connection of the counter electrode. A contact electrode 54 is provided on the substrate 12. The counter electrode 40 illustrated in FIG. 3 is connected to a wiring (not illustrated) at the contact electrode 54, the wiring being provided on the substrate 12. The contact electrode 54 is continuously provided along an outer edge (including the facing sides OS of the notch C) of the inclined portion 52. An end portion adjacent to the facing sides OS includes at least a part of the region X (refer to FIG. 5) that is assumed to be cut as described above, and a region Y is provided inside thereof. This region Y includes the contact electrode 54. Further, a region Z is provided inside the region Y. In the region Z, the plurality of pixels PX are arranged in a matrix.

Figure 7:
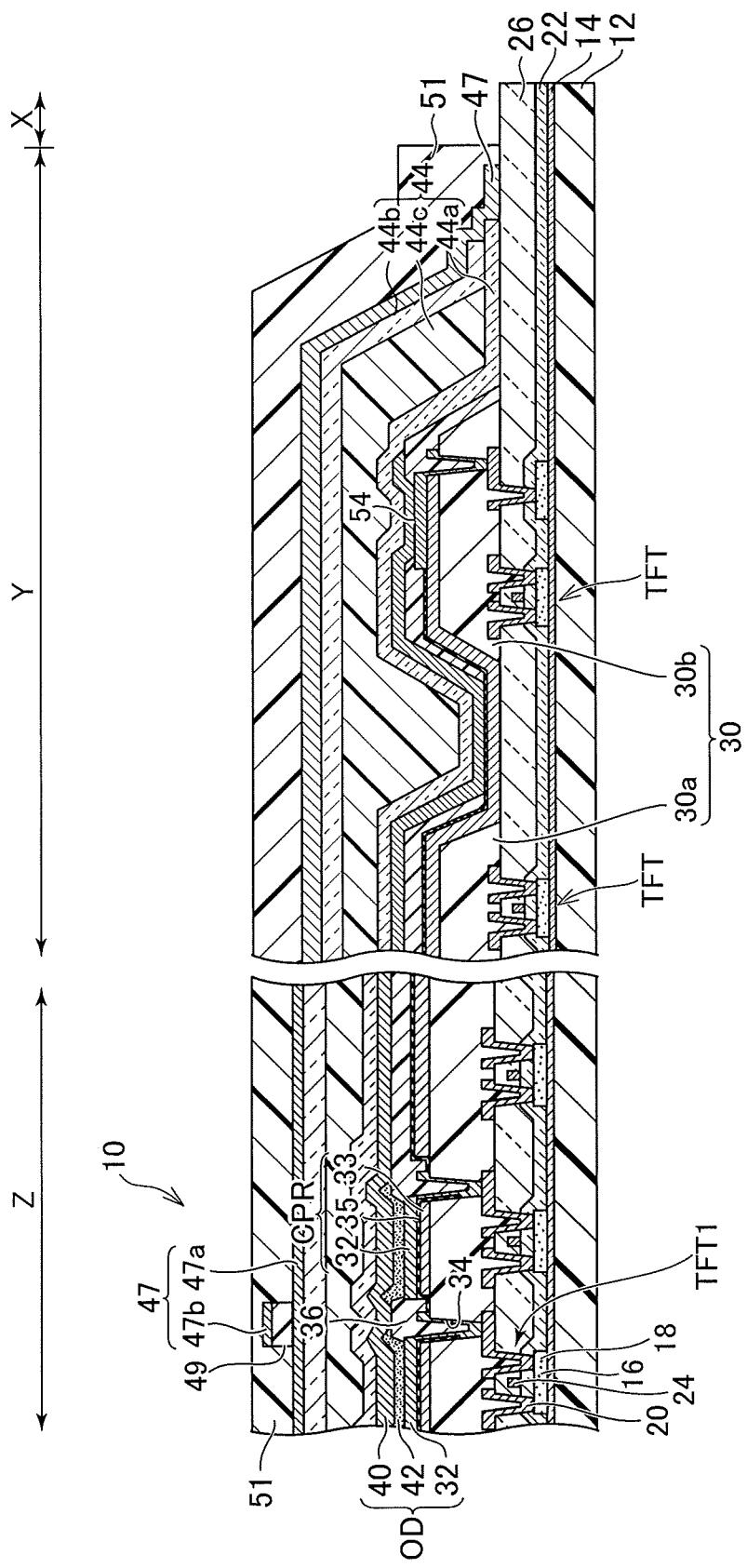
FIG. 7 is an enlarged view illustrating a cross-section of the display device illustrated in FIG. 6 taken along line VII-VII.

FIG. 7 is an enlarged view illustrating a cross-section of the display device illustrated in FIG. 6 taken along line VII-VII. In the region Y, the planarization layer 30 has a water blocking structure that is separated into a first region 30a and a second region 30b. The planarization layer 30 is formed of a resin (organic material) that is likely to absorb water, and the first region 30a on which the pixels PX are provided is separated from the second region 30b provided outside the first region 30a such that penetration of water from the outside is blocked. In addition, a thin film transistor TFT that constitutes a part of a peripheral circuit is arranged in the region Y. Further, the pixels PX are arranged in the region Z as described above using FIG. 3.

Figure 8:
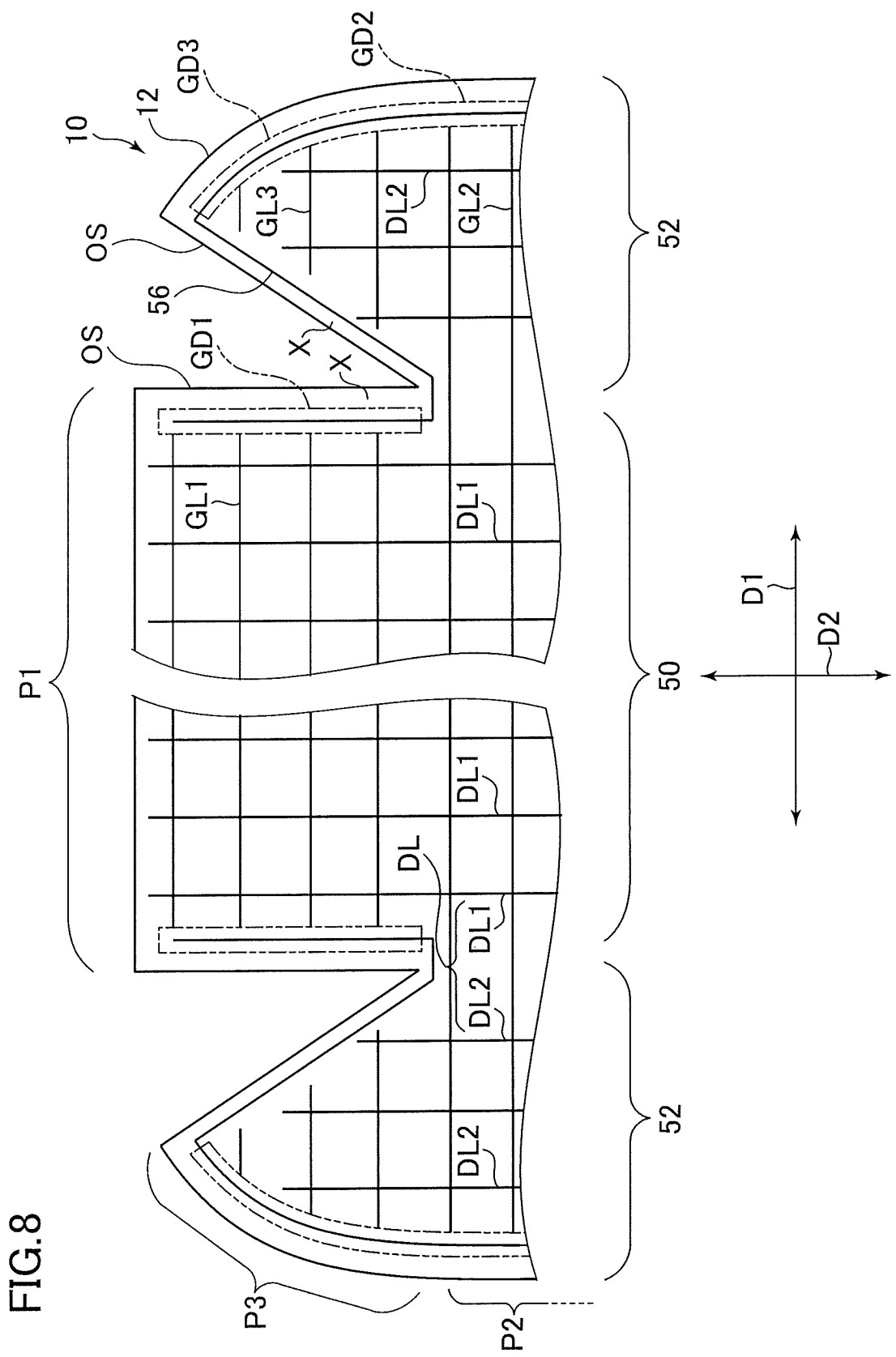
FIG. 8 is a diagram illustrating signal lines and scanning lines.

FIG. 8 is a diagram illustrating signal lines and scanning lines. The signal lines DL are provided on the substrate 12. The signal lines DL include a first group of signal lines DL1 that continuously pass through the flat portion 50 and the first portion P1. The signal lines DL include a second group of signal lines DL2 that continuously pass through the second portion P2 and the third portion P3.

A first scanning circuit GD1 is provided in the first portion P1. A plurality of first scanning lines GL1 are drawn out from the first scanning circuit GD1 in the first direction D1. The first scanning lines GL1 are provided in the first portion P1. The first scanning circuit GD1 is present at an end portion of the first portion P1 in the first direction D1.

A second scanning circuit GD2 is provided in the second portion P2. A plurality of second scanning lines GL2 are drawn out from the second scanning circuit GD2 in a direction intersecting the second direction D2. The second scanning lines GL2 extend in the first direction D1 at least in the flat portion 50. The second scanning lines GL2 are continuously provided in the second portion P2 and the flat portion 50. The second scanning circuit GD2 is present at an end portion of the second portion P2 opposite to the flat portion 50.

A third scanning circuit GD3 is provided in the third portion P3. For example, the second scanning circuit GD2 and the third scanning circuit GD3 are continuously provided. A plurality of third scanning lines GL3 are drawn out from the third scanning circuit GD3. The third scanning lines GL3 are provided in the third portion P3. The third scanning circuit GD3 is present at an end portion of the third portion P3 opposite to the flat portion 50. The third scanning lines GL3 extend in the first direction D1 in a state where the flexible display panel 10 is laid flat.

A control wiring 56 passes through the first scanning circuit GD1, the second scanning circuit GD2, and the third scanning circuit GD3. The control wiring 56 includes a portion that extends along the facing sides OS of the notch C. Each of the first scanning circuit GD1, the second scanning circuit GD2, and the third scanning circuit GD3 includes a shift register such that a start pulse is input to the shift register through the control wiring 56. The first scanning circuit GD1, the second scanning circuit GD2, the third scanning circuit GD3, and the control wiring 56 are provided in the region Y present inside of the region X that is assumed to be cut.

A scanning line driving includes a first driving, a second driving, and a third driving. During the first driving, the first scanning lines GL1 are sequentially selected. During the second driving, the second scanning lines GL2 are sequentially selected. During the third driving, the third scanning lines GL3 are sequentially selected. The first driving, the second driving, and the third driving are executed forward in an order in which the first portion P1 and the flat portion 50 are arranged. Alternatively, the first driving, the second driving, and the third driving may be executed backward in the order in which the first portion P1 and the flat portion 50 are arranged. The forward driving and the backward driving may be executed alternately.

Figure 9:
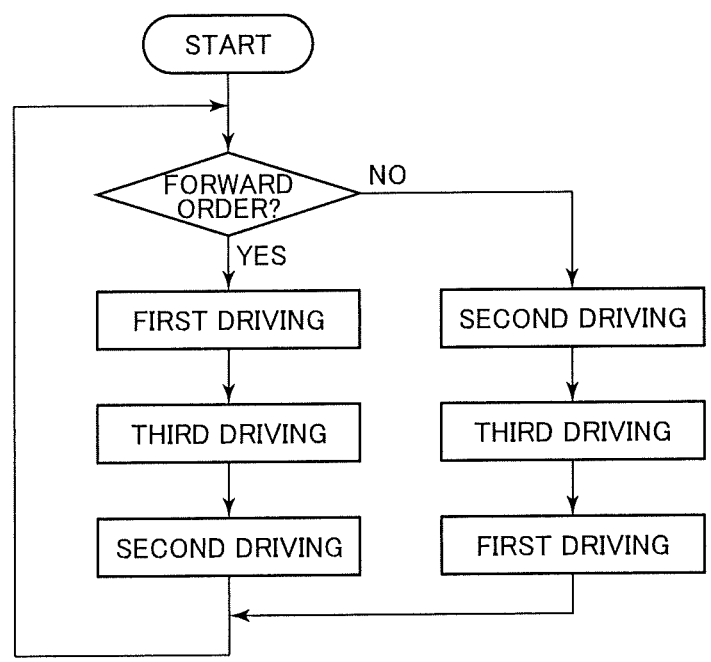
FIG. 9 is a diagram illustrating a method of driving the scanning lines.

FIG. 9 is a diagram illustrating a method of driving the scanning lines. In the embodiment, the first driving, the third driving, and the second driving may be executed at least either forward or backward in this order. For example, as illustrated in FIG. 9, whether or not the order is the forward order or the backward order is determined, and when the order is the forward order, the scanning line driving is executed in order of the first driving, the third driving, and the second driving. Alternatively, when the order is not the forward order, that is, is the backward order, the scanning line driving is executed in order of the second driving, the third driving, and the first driving.

Figure 10:
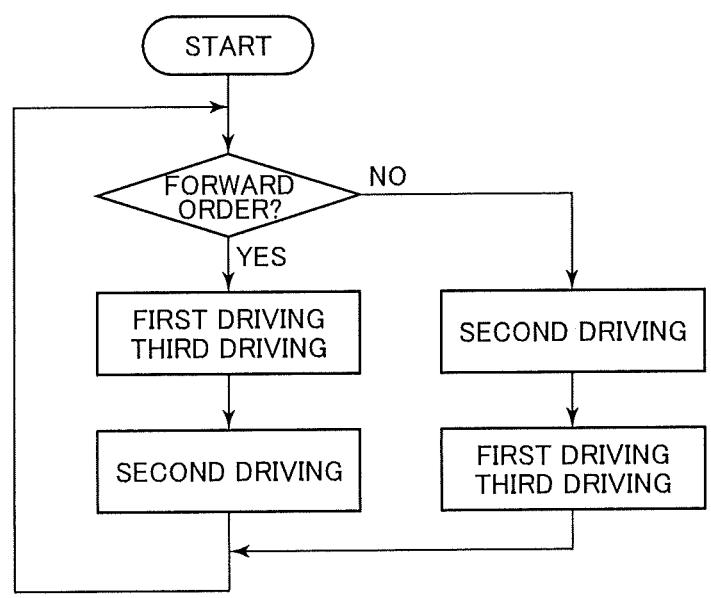
FIG. 10 is a diagram illustrating a modification example of the method of driving the scanning lines.

FIG. 10 is a diagram illustrating a modification example of the method of driving the scanning lines. In the modification example, the first driving and the third driving may be simultaneously executed during a period different from the second driving. For example, as illustrated in FIG. 10, whether or not the order is the forward order or the backward order is determined, and when the order is the forward order, the first driving and the third driving are simultaneously executed, and then the second driving is executed. Alternatively, when the order is not the forward order, that is, is the backward order, the second driving is executed, and then the first driving and the third driving are simultaneously executed.

Second Embodiment

Figure 11:
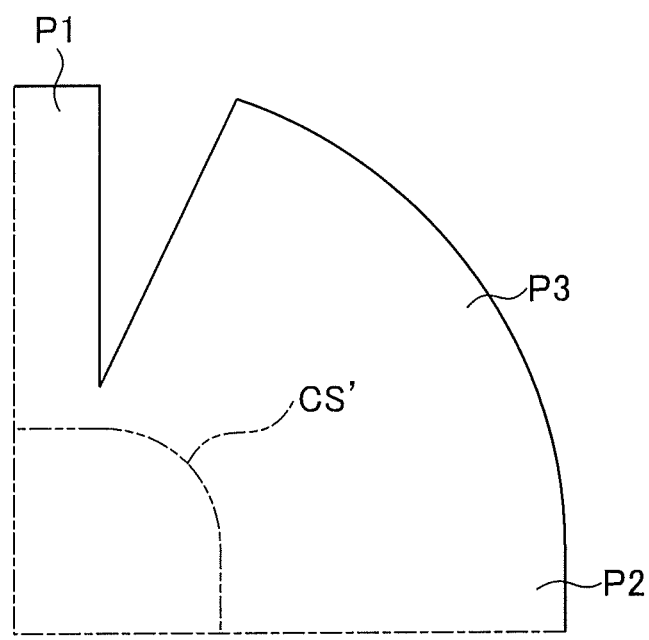
FIG. 11 is a diagram illustrating a display device according to a second embodiment of the present invention.

FIG. 11 is a diagram illustrating a display device according to a second embodiment of the present invention. In the embodiment, a corner side CS' has an arc shape. Other details correspond to the details described in the first embodiment. In the flexible display panel 10, the corner side CS' is rounded in an arc shape. Therefore, the substrate 12 is not damaged from the corner side CS' as a base.

Third Embodiment

Figure 12:
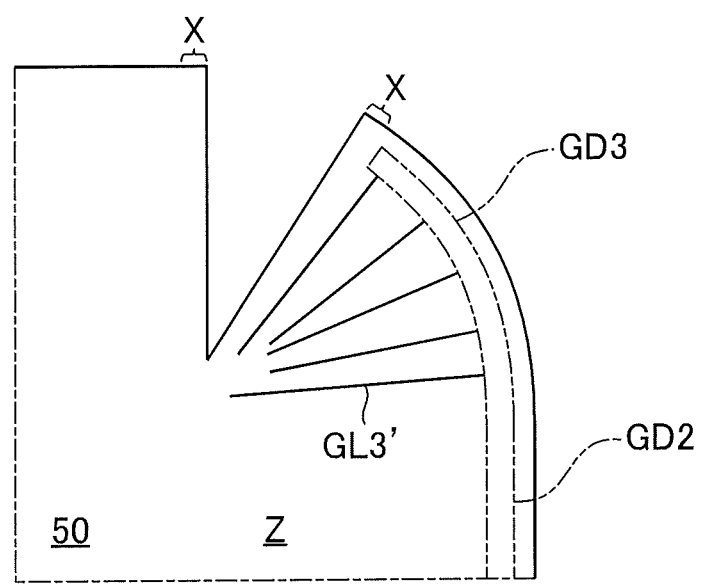
FIG. 12 is a diagram illustrating a display device according to a third embodiment of the present invention.

FIG. 12 is a diagram illustrating a display device according to a third embodiment of the present invention. In the embodiment, a plurality of third scanning lines GL3' are arranged in a radial pattern that spreads in a direction away from the flat portion 50. Other details correspond to the details described in the first embodiment. The third scanning lines GL3' include a plurality of third scanning lines having different lengths. The reason for this is that, since the number of pixels decreases toward the flat portion 50, the number of scanning lines required decreases. The third scanning lines GL3' are provided in the region Y present inside of the region X that is assumed to be cut. The second scanning circuit GD2 and the third scanning circuit GD3 are arranged in the region Y, and the third scanning lines GL3' are arranged in the region Z.

Fourth Embodiment

Figure 13:
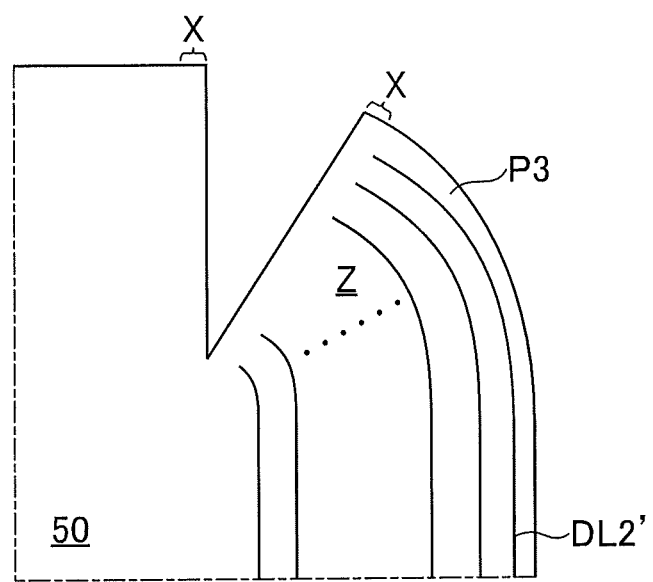
FIG. 13 is a diagram illustrating a display device according to a fourth embodiment of the present invention.

FIG. 13 is a diagram illustrating a display device according to a fourth embodiment of the present invention. In the embodiment, in the third portion P3, a second group of signal lines DL2' extend along a concentric circle having a center on the flat portion 50 side. The reason for this is that, since pixels are arranged along the concentric circle, it is necessary to drive these pixels. Other details correspond to the details described in the first embodiment. The second group of signal lines DL2' are provided in the region Z.

Fifth Embodiment

Figure 14:
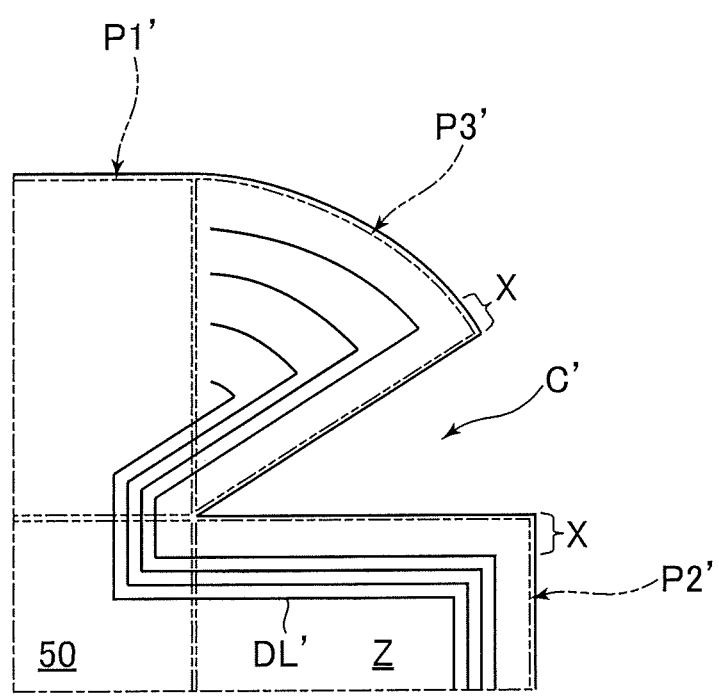
FIG. 14 is a diagram illustrating a display device according to a fifth embodiment of the present invention.

FIG. 14 is a diagram illustrating a display device according to a fifth embodiment of the present invention. In the embodiment, a notch C' is provided between a second portion P2' and a third portion P3'. A first portion P1' and the third portion P3' are continuously integrated. The signal lines include a group of signal lines DL' that pass through the second portion P2', the flat portion 50, and the third portion P3'. Other details correspond to the details described in the first embodiment. The signal lines DL' are provided in the region Z.

Sixth Embodiment

Figure 15:
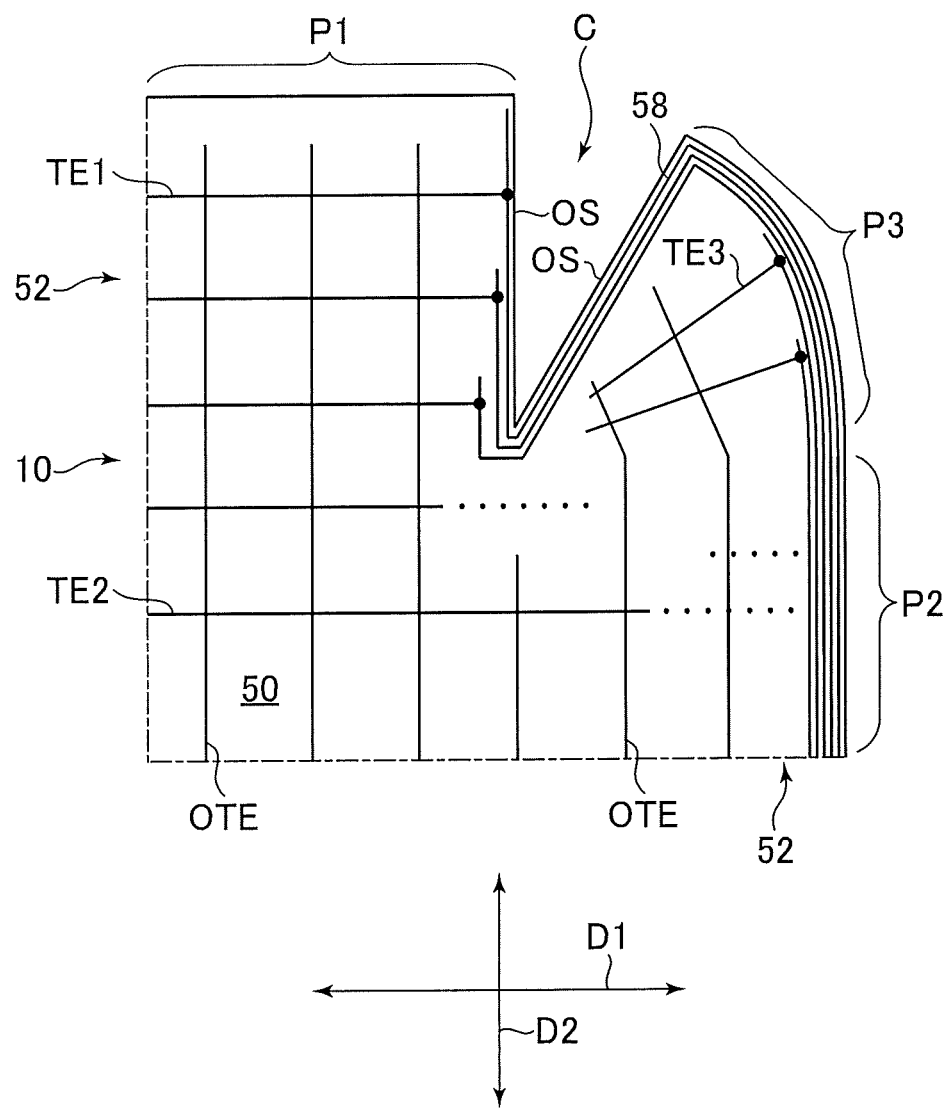
FIG. 15 is a diagram illustrating a display device according to a sixth embodiment of the present invention.

FIG. 15 is a diagram illustrating a display device according to a sixth embodiment of the present invention. In the embodiment, a plurality of first touch electrodes TE1 extend in the first direction D1 and are provided in the first portion P1. A plurality of second touch electrodes TE2 extend in the first direction D1 at least in the flat portion 50 and are continuously provided in the second portion P2 and the flat portion 50. A plurality of third touch electrodes TE3 are provided in the third portion P3. The third touch electrodes TE3 are arranged in a radial pattern that spreads in a direction away from the flat portion 50.

A plurality of connection wirings 58 are provided in the inclined portion 52. The connection wirings 58 include a portion along the facing sides OS of the notch C and pass through an outer edge portion of the inclined portion 52. The connection wirings 58 are connected to the first touch electrodes TE1, the second touch electrodes TE2, and the third touch electrodes TE3, respectively. Tips of the third touch electrodes TE3 in the direction in which the radial pattern spreads spread direction are connected to the connection wirings 58.

A plurality of facing touch electrodes OTE extend and face in a direction intersecting the first touch electrodes TE1, the second touch electrodes TE2, and the third touch electrodes TE3. The facing touch electrodes OTE extend in a direction toward the facing sides OS of the notch C in the third portion P3. Each of the first touch electrodes TE1, the second touch electrodes TE2, and the third touch electrodes TE3 executes touch sensing depending on a change in capacitance from each of the facing touch electrodes OTE. Other details correspond to the details described in the first embodiment. The connection wirings 58 are provided in the region Y present inside of the region X that is assumed to be cut.

Seventh Embodiment

Figure 16:
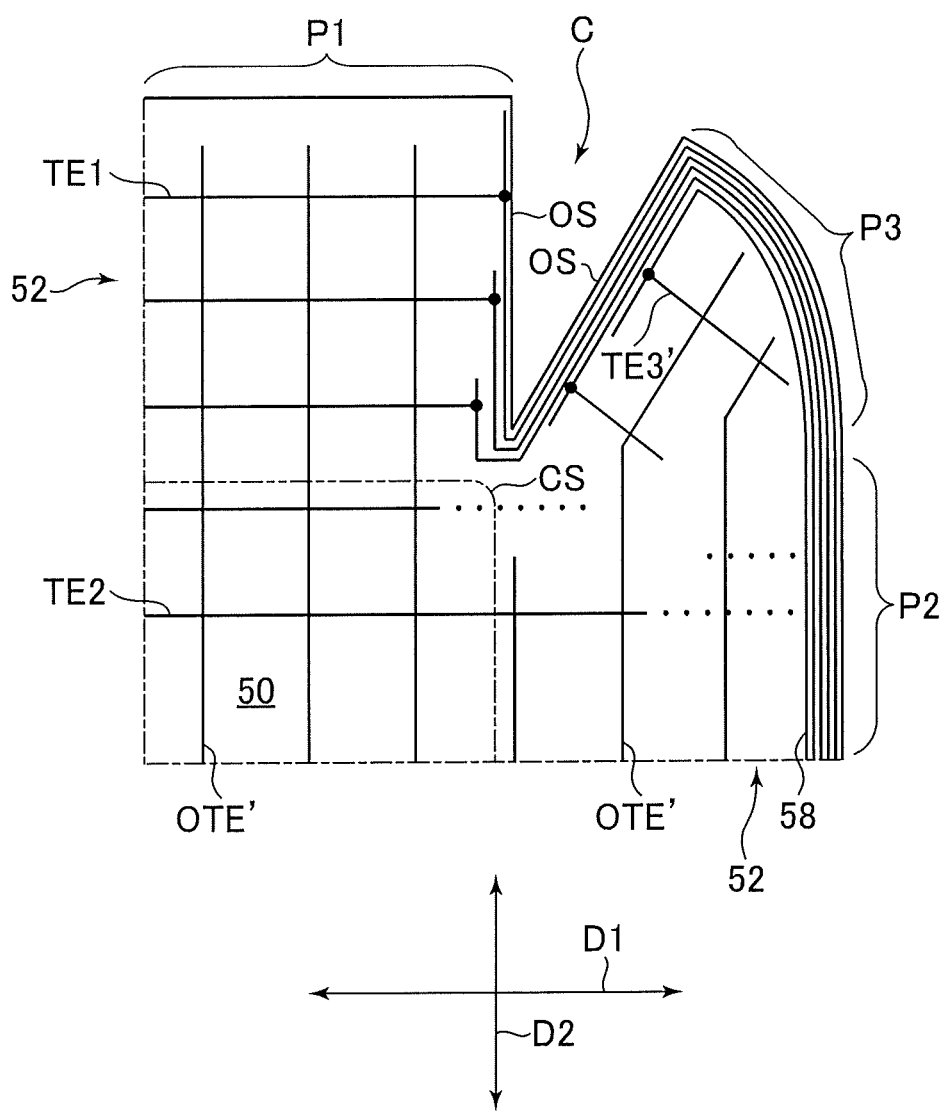
FIG. 16 is a diagram illustrating a display device according to a seventh embodiment of the present invention.

FIG. 16 is a diagram illustrating a display device according to a seventh embodiment of the present invention. In the embodiment, the first touch electrodes TE1 extend in the first direction D1 and are provided in the first portion P1. The second touch electrodes TE2 extend in the first direction at least in the flat portion 50 and are continuously provided in the second portion P2 and the flat portion 50. A plurality of third touch electrodes TE3' are provided in the third portion P3. The third touch electrodes TE3' extend in a direction along the tangent of the corner side CS and are connected to the connection wirings 58 at an end portion of the third portion P3 along the notch C.

The connection wirings 58 are provided in the inclined portion 52. The connection wirings 58 include the portion along the facing sides OS of the notch C and pass through the outer edge portion of the inclined portion 52. The connection wirings 58 are connected to the first touch electrodes TE1, the second touch electrodes TE2, and the third touch electrodes TE3', respectively.

A plurality of facing touch electrodes OTE' extend and face in a direction intersecting the first touch electrodes TE1, the second touch electrodes TE2, and the third touch electrodes TE3'. The facing touch electrodes OTE' extend in a direction away from the facing sides OS of the notch C in the third portion P3. Each of the first touch electrodes TE1, the second touch electrodes TE2, and the third touch electrodes TE3' executes touch sensing depending on a change in capacitance from each of the facing touch electrodes OTE'. Other details correspond to the details described in the first embodiment. The connection wirings 58 are provided in the region Y present inside of the region X that is assumed to be cut.

The display device is not limited to the organic electroluminescence display device and may be a display device including a light emitting element such as a quantum-dot light emitting diode (QLED) in each pixel or may be a liquid crystal display device.

While there have been described what are at present considered to be certain embodiments, it will be understood that various modifications may be made thereto, and it is intended that the appended claims cover all such modifications as fall within the true spirit and scope of the invention. Further, embodiments may be combined with each other unless the embodiments are contradictory to each other.

What is claimed is:

1. A display device comprising:
a flexible display panel that includes a display area on which an image is displayed,
wherein the display area includes a main display area and a sub-display area adjacent to the main display area,
the flexible display panel includes a flat portion that includes the main display area and an inclined portion that extends to be bent and inclined from the flat portion and includes the sub-display area,
the flat portion includes a first side that extends in a first direction, a second side that extends in a second direction intersecting the first direction, and a corner side that is provided between the first side and the second side and of which a tangent intersects both the first side and the second side,
the inclined portion includes a first portion that is bent along the first side, a second portion that is bent along the second side, and a third portion that is bent from the corner side,
the flexible display panel includes a notch that is provided between the first portion and the second portion and of which a gap spreads in a direction away from the flat portion in a state that the flexible display panel is laid flat, and
facing sides of the notch facing each other are adjacent to each other in a state that the flexible display panel is bent,
further comprising:
a first scanning circuit that is provided in the first portion;
a second scanning circuit that is provided in the second portion;
a third scanning circuit that is provided in the third portion;
a plurality of first scanning lines that are drawn out from the first scanning circuit in the first direction and are provided in the first portion;
a plurality of second scanning lines that are drawn out from the second scanning circuit in a direction intersecting the second direction and are continuously provided in the second portion and the flat portion to extend in the first direction at least in the flat portion;
a plurality of third scanning lines that are drawn out from the third scanning circuit and are provided in the third portion, and
a control wiring that passes through the first scanning circuit, the second scanning circuit, and the third scanning circuit,
wherein the control wiring includes a portion that extends along the facing sides of the notch.

2. The display device according to claim 1, wherein in the flat portion, the second side is provided on each of both sides of the first side.

3. The display device according to claim 1, wherein the notch has a V-shape in which an inner corner has an acute angle.

4. The display device according to claim 1, wherein the corner side has an arc shape.

5. The display device according to claim 1, wherein the flexible display panel includes a substrate, a plurality of pixel electrodes that are provided on the substrate, a common electrode that faces the pixel electrodes, and a contact electrode that is provided on the substrate to be connected to the common electrode, and
the contact electrode includes the facing sides of the notch and is continuously provided along an outer edge of the inclined portion.

6. The display device according to claim 1, wherein the flexible display panel includes the notch that is provided between the first portion and the third portion, and
the second portion and the third portion are continuously integrated.

7. The display device according to claim 6, further comprising a plurality of signal lines,
wherein the signal lines include a first group of signal lines that continuously pass through the flat portion and the first portion and a second group of signal lines that continuously pass through the second portion and the third portion.

8. The display device according to claim 7,
wherein in the third portion, the second group of signal lines extend along a concentric circle having a center on the flat portion side.

9. The display device according to claim 1,
wherein the flexible display panel includes the notch that is provided between the second portion and the third portion, and
the first portion and the third portion are continuously integrated.

10. The display device according to claim 9, further comprising a plurality of signal lines,
the signal lines include a group of signal lines that passes through the second portion, the flat portion, and the third portion.

11. A display device comprising:
a flexible display panel that includes a display area on which an image is displayed,
wherein the display area includes a main display area and a sub-display area adjacent to the main display area,
the flexible display panel includes a flat portion that includes the main display area and an inclined portion that extends to be bent and inclined from the flat portion and includes the sub-display area,
the flat portion includes a first side that extends in a first direction, a second side that extends in a second direction intersecting the first direction, and a corner side that is provided between the first side and the second side and of which a tangent intersects both the first side and the second side,
the inclined portion includes a first portion that is bent along the first side, a second portion that is bent along the second side, and a third portion that is bent from the corner side,
the flexible display panel includes a notch that is provided between the first portion and the second portion and of which a gap spreads in a direction away from the flat portion in a state that the flexible display panel is laid flat, and
facing sides of the notch facing each other are adjacent to each other in a state that the flexible display panel is bent,
further comprising:
a first scanning circuit that is provided in the first portion;
a second scanning circuit that is provided in the second portion;
a third scanning circuit that is provided in the third portion;
a plurality of first scanning lines that are drawn out from the first scanning circuit in the first direction and are provided in the first portion;
a plurality of second scanning lines that are drawn out from the second scanning circuit in a direction intersecting the second direction and are continuously provided in the second portion and the flat portion to extend in the first direction at least in the flat portion; and
a plurality of third scanning lines that are drawn out from the third scanning circuit and are provided in the third portion,
wherein the first scanning circuit is present at an end portion of the first portion in the first direction,
the second scanning circuit is present at an end portion of the second portion opposite to the flat portion, and
the third scanning circuit is present at an end portion of the third portion opposite to the flat portion.

12. The display device according to claim 11,
wherein the third scanning lines are drawn out from the third scanning circuit to extend in the first direction in a state where the flexible display panel is laid flat.

13. The display device according to claim 11,
wherein the third scanning lines are arranged in a radial pattern that spreads in a direction away from the flat portion.

14. A display device comprising:
a flexible display panel that includes a display area on which an image is displayed,
wherein the display area includes a main display area and a sub-display area adjacent to the main display area,
the flexible display panel includes a flat portion that includes the main display area and an inclined portion that extends to be bent and inclined from the flat portion and includes the sub-display area,
the flat portion includes a first side that extends in a first direction, a second side that extends in a second direction intersecting the first direction, and a corner side that is provided between the first side and the second side and of which a tangent intersects both the first side and the second side,
the inclined portion includes a first portion that is bent along the first side, a second portion that is bent along the second side, and a third portion that is bent from the corner side,
the flexible display panel includes a notch that is provided between the first portion and the second portion and of which a gap spreads in a direction away from the flat portion in a state that the flexible display panel is laid flat, and
facing sides of the notch facing each other are adjacent to each other in a state that the flexible display panel is bent, further comprising:
a first scanning circuit that is provided in the first portion;
a second scanning circuit that is provided in the second portion;
a third scanning circuit that is provided in the third portion;
a plurality of first scanning lines that are drawn out from the first scanning circuit in the first direction and are provided in the first portion;
a plurality of second scanning lines that are drawn out from the second scanning circuit in a direction intersecting the second direction and are continuously provided in the second portion and the flat portion to extend in the first direction at least in the flat portion; and
a plurality of third scanning lines that are drawn out from the third scanning circuit and are provided in the third portion,
wherein a first driving for sequentially selecting the first scanning lines, a second driving for sequentially selecting the second scanning lines, and a third driving for sequentially selecting the third scanning lines are executed at least either forward or backward in an order in which the first portion and the flat portion are arranged.

15. The display device according to claim 14,
wherein a scanning line driving is executed at least either forward or backward in an order of the first driving, the third driving, and the second driving.

16. The display device according to claim 14,
wherein the first driving and the third driving are simultaneously executed during a period different from the second driving.

17. The display device according to claim 1, wherein an angle between the flat portion and the first portion at a backside of the substrate is obtuse angle.

18. The display device according to claim 17, wherein an angle between the flat portion and the facing side at a backside of the substrate is obtuse angle.

* * * * *